(12) United States Patent
Nishisaka et al.

(10) Patent No.: US 9,363,896 B2
(45) Date of Patent: *Jun. 7, 2016

(54) CERAMIC ELECTRONIC COMPONENT AND METHOD FOR MANUFACTURING THE SAME

(71) Applicant: Murata Manufacturing Co., Ltd., Nagaokakyo-shi, Kyoto-fu (JP)

(72) Inventors: Yasuhiro Nishisaka, Nagaokakyo (JP); Yukio Sanada, Nagaokakyo (JP); Koji Sato, Nagaokakyo (JP); Seiichi Matsumoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 106 days.

This patent is subject to a terminal disclaimer.

(21) Appl. No.: 14/154,204

(22) Filed: Jan. 14, 2014

(65) Prior Publication Data

US 2014/0127493 A1 May 8, 2014

Related U.S. Application Data

(63) Continuation of application No. 14/071,684, filed on Nov. 5, 2013, now Pat. No. 8,891,225, which is a continuation of application No. 13/923,396, filed on Jun. 21, 2013, now Pat. No. 8,587,925, which is a continuation of application No. 13/115,243, filed on May 25, 2011, now Pat. No. 8,564,931.

(30) Foreign Application Priority Data

May 27, 2010 (JP) ................... 2010-121867
Feb. 23, 2011 (JP) ................... 2011-036860

(51) Int. Cl.
*H01G 4/228* (2006.01)
*H05K 1/18* (2006.01)
(Continued)

(52) U.S. Cl.
CPC ............... *H05K 1/182* (2013.01); *H01C 7/008* (2013.01); *H01F 27/2804* (2013.01); *H01G 4/232* (2013.01); *H01G 4/30* (2013.01); *H01L 41/083* (2013.01)

(58) Field of Classification Search
None
See application file for complete search history.

(56) References Cited

U.S. PATENT DOCUMENTS 7,345,868 B2    3/2008    Trinh
8,564,931 B2   10/2013    Nishisaka et al.
(Continued)

OTHER PUBLICATIONS

Nishisaka et al., "Ceramic Electronic Component and Method for Manufacturing the Same", U.S. Appl. No. 13/115,243, filed May 25, 2011.
(Continued)

*Primary Examiner* — Humera Sheikh
*Assistant Examiner* — Seth Dumbris
(74) *Attorney, Agent, or Firm* — Keating & Bennett, LLP

(57) ABSTRACT

A ceramic electronic component includes a ceramic element assembly and external electrodes. The external electrodes are disposed on the ceramic element assembly. The external electrodes include an underlying electrode layer and a first Cu plating film. The underlying electrode layer is disposed on the ceramic element assembly. The first Cu plating film is disposed on the underlying electrode layer. The underlying electrode layer includes a metal that is diffusible in Cu and a ceramic bonding material. The metal that is diffusible in Cu is diffused in at least a surface layer in the underlying electrode layer side of the first Cu plating film.

16 Claims, 16 Drawing Sheets

(51) Int. Cl.
*H01G 4/232* (2006.01)
*H01G 4/30* (2006.01)
*H01C 7/00* (2006.01)
*H01F 27/28* (2006.01)
*H01L 41/083* (2006.01)

(56) References Cited

U.S. PATENT DOCUMENTS

| | | | |
|---|---|---|---|
| 8,587,925 | B2 | 11/2013 | Nishisaka et al. |
| 8,891,225 | B2* | 11/2014 | Nishisaka et al. ......... 361/306.1 |
| 2003/0231457 | A1 | 12/2003 | Ritter et al. |
| 2004/0022009 | A1 | 2/2004 | Galvagni et al. |
| 2004/0090732 | A1 | 5/2004 | Ritter et al. |
| 2004/0197973 | A1 | 10/2004 | Ritter et al. |
| 2004/0218344 | A1 | 11/2004 | Ritter et al. |
| 2004/0218373 | A1 | 11/2004 | Ritter et al. |
| 2004/0257748 | A1 | 12/2004 | Ritter et al. |
| 2004/0264105 | A1 | 12/2004 | Galvagni et al. |
| 2005/0046536 | A1 | 3/2005 | Ritter et al. |
| 2005/0146837 | A1 | 7/2005 | Ritter et al. |
| 2007/0014075 | A1 | 1/2007 | Ritter et al. |
| 2007/0096254 | A1 | 5/2007 | Ritter et al. |
| 2007/0133147 | A1 | 6/2007 | Ritter et al. |
| 2008/0118721 | A1* | 5/2008 | Horie et al. ................... 428/209 |
| 2009/0002921 | A1 | 1/2009 | Ritter et al. |
| 2010/0123994 | A1* | 5/2010 | Nishisaka et al. ......... 361/306.3 |
| 2010/0128411 | A1* | 5/2010 | Onishi et al. ................. 361/302 |
| 2013/0240366 | A1 | 9/2013 | Ritter et al. |

OTHER PUBLICATIONS

Nishisaka et al., "Ceramic Electronic Component and Method for Manufacturing the Same", U.S. Appl. No. 13/923,396, filed Jun. 21, 2013.

Nishisaka et al., "Ceramic Electronic Component and Method for Manufacturing the Same", U.S. Appl. No. 14/071,684, filed Nov. 5, 2013.

* cited by examiner

CERAMIC ELECTRONIC COMPONENT AND METHOD FOR MANUFACTURING THE SAME

BACKGROUND OF THE INVENTION

1. Field of the Invention

The present invention relates to a ceramic electronic component and a method for manufacturing the same. In particular, the present invention relates to an embedded ceramic electronic component, which is arranged to be embedded in a wiring board, and a method for manufacturing the same.

2. Description of the Related Art

In recent years, along with miniaturization and thickness reduction of electronic apparatuses, e.g., cellular phones and portable music players, wiring boards mounted on the electronic apparatuses have been miniaturized.

Japanese Unexamined Patent Application Publication No. 2002-100875 discloses a method for miniaturizing a wiring board in which a ceramic electronic component is embedded inside of a wiring board and, in addition, wiring to the ceramic electronic component is formed by using a via hole disposed on the ceramic electronic component. According to this method, it is not necessary to provide a region on the surface of a wiring board for mounting a ceramic electronic component and, in addition, it is not necessary to provide a region for wiring to the ceramic electronic component separately from the region for mounting the ceramic electronic component. Consequently, a wiring board including a built-in component can be miniaturized.

The via hole for connecting a ceramic electronic component is formed by using, for example, a laser, e.g., a $CO_2$ laser. When the via hole is formed using the laser, the laser is applied directly to an external electrode of the electronic component. Therefore, it is preferable that the external electrode includes a Cu plating film to reflect the laser at a high reflectance. This is because if the reflectance of the external electrode with respect to the laser is low, the laser penetrates to the inside of the ceramic electronic component and, thereby, the ceramic electronic component may be damaged.

Regarding the ceramic electronic component embedded in the inside of the wiring board, a reduction in profile has been extremely desirable from the viewpoint of thickness reduction of the wiring board.

For a method for reducing the profile of the ceramic electronic component, it is preferable to fire an underlying electrode layer located immediately above a ceramic element assembly, among external electrodes, at the same time with the ceramic element assembly including internal electrodes, that is, to form through cofiring. This is because the maximum thickness of the underlying electrode layer can be reduced by the above-described method as compared to when the underlying electrode layer is formed by, for example, baking an electrically conductive paste applied through dipping.

In this regard, when the underlying electrode layer is formed through cofiring, it is necessary to increase the content of a ceramic bonding material, e.g., a ceramic material, in the underlying electrode layer in order to ensure high adhesion between the ceramic element assembly and the underlying electrode layer. However, if the content of the ceramic bonding material in the underlying electrode layer is increased, the content of the metal component in the underlying electrode layer is decreased. Consequently, the adhesion between the underlying electrode layer and a plating layer disposed on the underlying electrode layer is reduced. Therefore, there is a problem in that the reliability of the electronic component is degraded.

SUMMARY OF THE INVENTION

To overcome the problems described above, preferred embodiments of the present invention provide a highly reliable ceramic electronic component provided with an external electrode including an underlying electrode layer disposed on a ceramic element assembly and a Cu plating film disposed on the underlying electrode layer.

A ceramic electronic component according to a preferred embodiment of the present invention preferably includes a ceramic element assembly and an external electrode. The external electrode is disposed on the ceramic element assembly. The external electrode preferably includes an underlying electrode layer and a first Cu plating film, for example. The underlying electrode layer is disposed on the ceramic element assembly. The first Cu plating film is disposed on the underlying electrode layer. The underlying electrode layer preferably includes a metal that is diffusible in Cu and a ceramic bonding material, for example. The metal that is diffusible in Cu is diffused in at least a surface layer in the underlying electrode layer side of the first Cu plating film.

According to another preferred embodiment of the present invention, grain boundaries are preferably present in the first Cu plating film. The metal that is diffusible in Cu is diffused along the grain boundaries of the first Cu plating film.

According to another preferred embodiment of the present invention, the metal that is diffusible in Cu is preferably diffused up to the surface opposite to the underlying electrode layer of the first Cu plating film. With this configuration, the adhesion between the first Cu plating film and the underlying electrode layer is more effectively improved.

According to another preferred embodiment of the present invention, the metal that is diffusible in Cu is preferably at least one type of metal selected from the group consisting of Ni, Ag, Pd, and Au, for example.

According to another preferred embodiment of the present invention, the external electrode preferably further includes a second Cu plating film disposed on the first Cu plating film, and the metal that is diffusible in Cu is not diffused in the second Cu plating film. With this configuration, the second Cu plating film, in which the metal that is diffusible in Cu is not diffused, is provided and, thereby, the reflectance at the external electrode with respect to the laser light incident on the external electrode is further increased. Consequently, even when the laser light is applied to the external electrode, the ceramic element assembly is not damaged. Therefore, the ceramic electronic component is effectively used as an embedded ceramic electronic component.

According to another preferred embodiment of the present invention, Cu is diffused in the underlying electrode layer from the first Cu plating film. In this case, the adhesion between the underlying electrode layer and the first Cu plating film can be more enhanced.

A method for manufacturing a ceramic electronic component according to a preferred embodiment of the present invention is a method for manufacturing a ceramic electronic component provided with a ceramic element assembly and an external electrode disposed on the ceramic element assembly. In the method for manufacturing a ceramic electronic component according to this preferred embodiment of the present invention, an underlying electrode layer including a metal that is diffusible in Cu and a ceramic bonding material are preferably formed on the ceramic element assembly, and a first Cu plating film is formed on the underlying electrode layer. Thereafter, the underlying electrode layer and the first Cu plating film are heated, so as to form the external electrode by diffusing the metal that is diffusible in Cu into at least the surface layer in the underlying electrode layer side of the first Cu plating film.

According to another preferred embodiment of the present invention, the external electrode is preferably formed by further forming a second Cu plating film on the first Cu plating film after the heating of the underlying electrode layer and the first Cu plating film, so as to diffuse the metal that is diffusible in Cu into at least the surface layer in the underlying electrode layer side of the first Cu plating film. In this case, the second Cu plating film, in which the metal that is diffusible in Cu is not diffused, is formed, so that the reflectance at the external electrode with respect to the laser light incident on the external electrode is increased and a ceramic electronic component that can be used as an embedded ceramic electronic component is produced.

According to another preferred embodiment of the present invention, the external electrode is preferably formed by heating the underlying electrode layer and the first Cu plating film in a range of about 350° C. to about 800° C., for example, so as to diffuse the metal that is diffusible in Cu into at least the surface layer in the underlying electrode layer side of the first Cu plating film. In this case, the metal that is diffusible in Cu is more effectively diffused.

In various preferred embodiments of the present invention, the metal that is diffusible in Cu included in the underlying electrode layer is diffused into at least the surface layer in the underlying electrode layer side of the first Cu plating film. Consequently, the adhesion between the underlying electrode layer and the first Cu plating film is improved. Therefore, the reliability of the ceramic electronic component is effectively improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
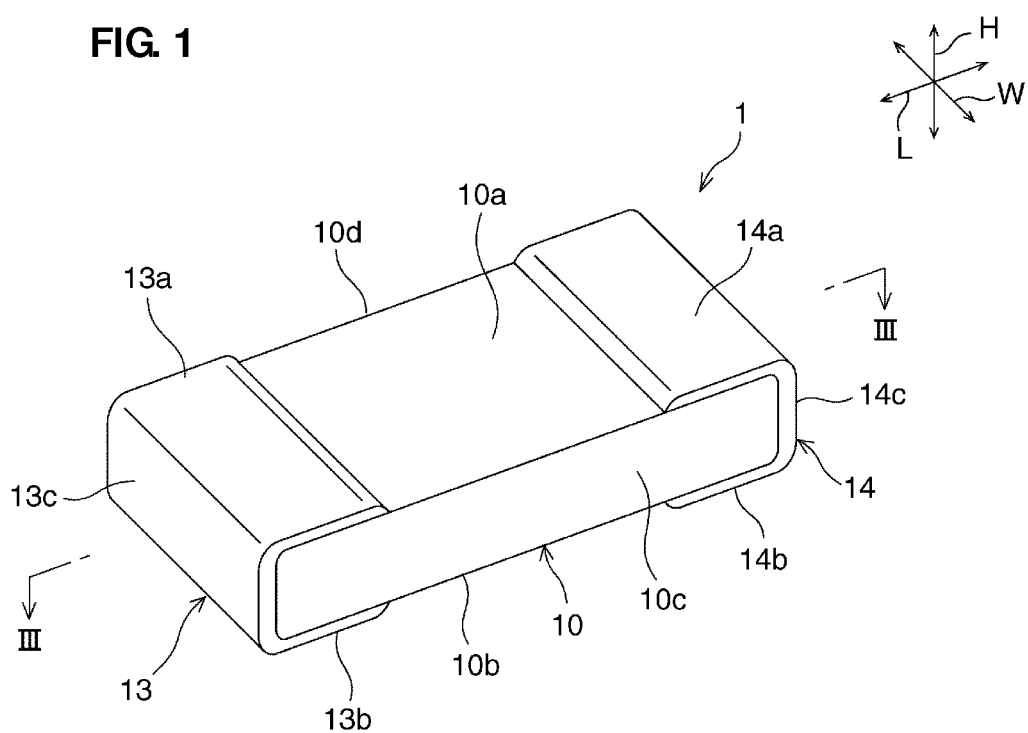
FIG. 1 is a schematic perspective view of a ceramic electronic component according to a first preferred embodiment of the present invention.

Preferred embodiments of the present invention will be described below with reference to a ceramic electronic component 1 shown in the drawings as an example. However, the ceramic electronic component 1 is no more than an example. The present invention is not limited to the ceramic electronic component 1 and the manufacturing method thereof described below.

First Preferred Embodiment

Figure 2:
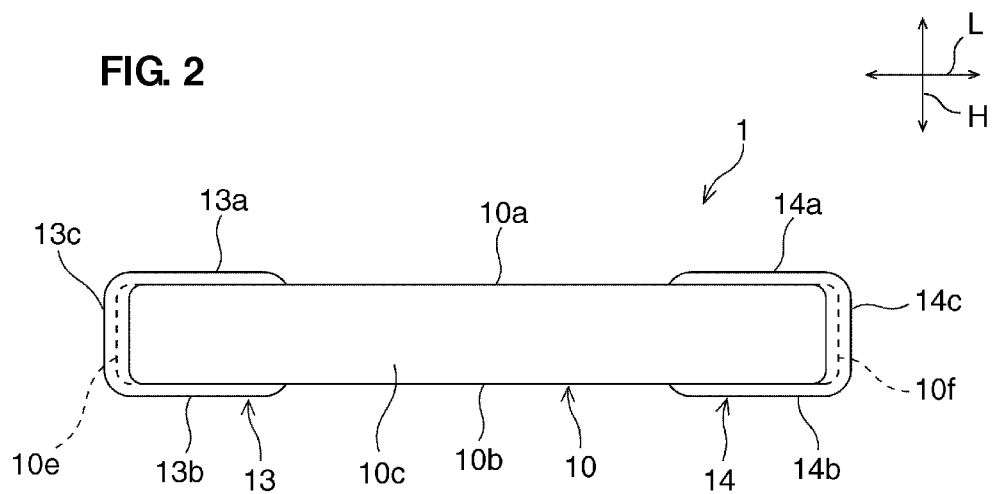
FIG. 2 is a schematic side view of the ceramic electronic component according to the first preferred embodiment of the present invention.
Figure 3:
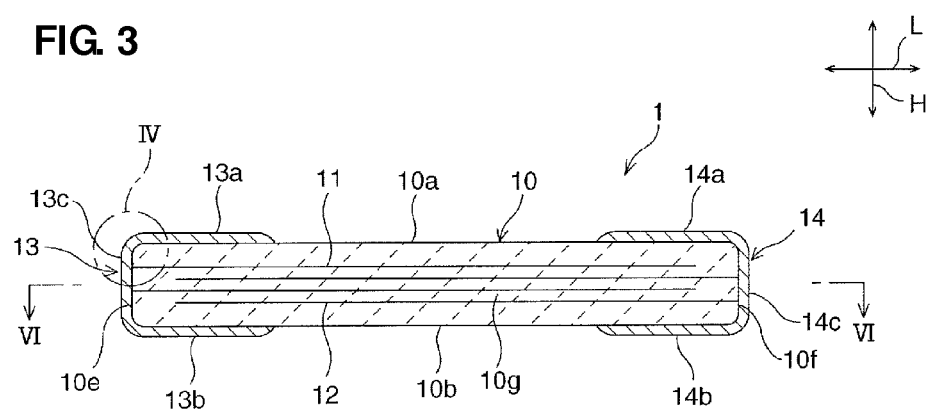
FIG. 3 is a schematic sectional view along a line III-III shown in FIG. 1.
Figure 4:
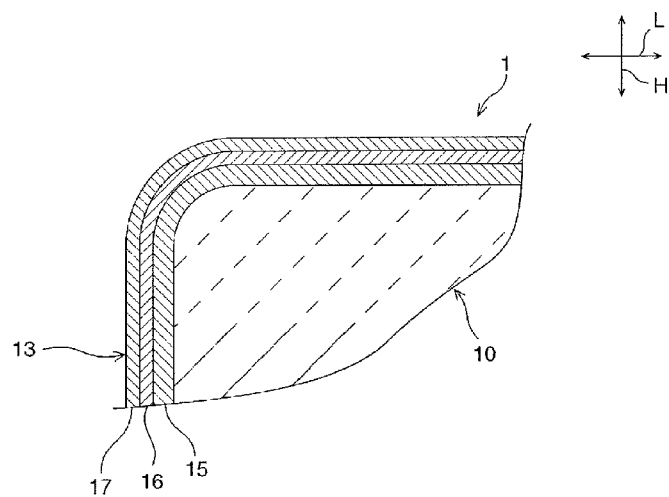
FIG. 4 is a magnified schematic sectional view of a portion surrounded by a line IV shown in FIG. 3.
Figure 5:
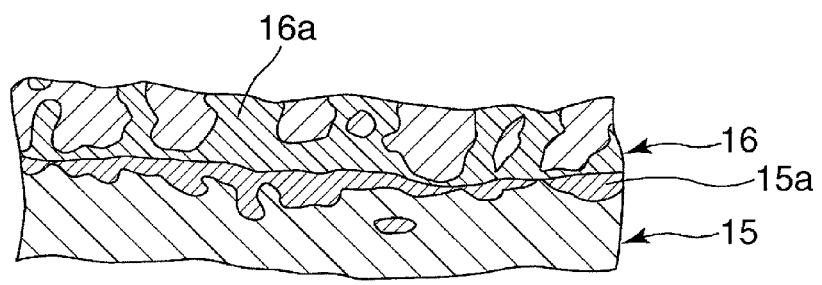
FIG. 5 is a magnified schematic sectional view of a part of a first external electrode.
Figure 6:
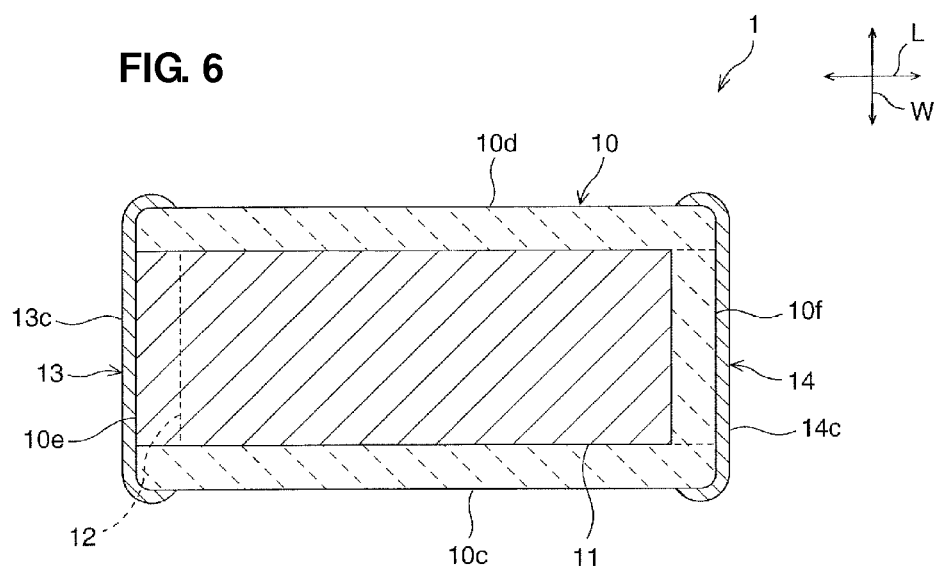
FIG. 6 is a schematic sectional view along a line VI-VI shown in FIG. 3.

FIG. 1 is a schematic perspective view of a ceramic electronic component according to a first preferred embodiment of the present invention. FIG. 2 is a schematic side view of the ceramic electronic component according to the first preferred embodiment. FIG. 3 is a schematic sectional view along a line III-III shown in FIG. 1. FIG. 4 is a magnified schematic sectional view of a portion surrounded by a line IV shown in FIG. 3. FIG. 5 is a magnified schematic sectional view of a portion of a first external electrode. FIG. 6 is a schematic sectional view along a line VI-VI shown in FIG. 3.

The configuration of the ceramic electronic component 1 will be described with reference to FIGS. 1 to 6.

As shown in FIGS. 1 to 3 and 6, the ceramic electronic component 1 includes a ceramic element assembly 10. The ceramic element assembly 10 is made of an appropriate ceramic material in accordance with the function of the ceramic electronic component 1. Specifically, when the ceramic electronic component 1 is a capacitor, the ceramic element assembly 10 is preferably made of a dielectric ceramic material. Specific examples of dielectric ceramic materials include $BaTiO_3$, $CaTiO_3$, $SrTiO_3$, and $CaZrO_3$. The ceramic element assembly 10 may preferably include the above-described ceramic material as a primary component, and secondary components, e.g., Mn compounds, Mg compounds, Si compounds, Fe compounds, Cr compounds, Co compounds, Ni compounds, and rare-earth compounds, may be added in accordance with the characteristics of a desired ceramic electronic component 1.

When the ceramic electronic component 1 is a ceramic piezoelectric element, the ceramic element assembly 10 may preferably be made of a piezoelectric ceramic material. Specific examples of the piezoelectric ceramic materials include lead zirconate titanate (PZT) based ceramic materials.

When the ceramic electronic component 1 is a thermistor element, the ceramic element assembly 10 may preferably be made of a semiconductor material. Specific examples of the semiconductor ceramic materials include spinel based ceramic materials.

When the ceramic electronic component 1 is an inductor element, the ceramic element assembly 10 may preferably be made of a magnetic ceramic material. Specific examples of the magnetic ceramic materials include ferrite ceramic materials.

The shape of the ceramic element assembly 10 is not specifically limited. In the present preferred embodiment, the ceramic element assembly 10 has a substantially rectangular parallelepiped shape. As shown in FIGS. 1 to 3, the ceramic element assembly 10 includes first and second principal surfaces 10a and 10b that extend in the length direction L and the width direction W. As shown in FIGS. 1, 2, and 6, the ceramic element assembly 10 includes first and second side surfaces 10c and 10d that extend in the height direction H and the length direction L. Furthermore, as shown in FIGS. 2, 3, and 6, first and second end surfaces 10e and 10f that extend in the height direction H and the width direction W are provided.

In the present specification, the term "a substantially rectangular parallelepiped shape" includes rectangular parallelepipeds having chamfered or R-chamfered corner portions and ridge portions. That is, members having "a substantially rectangular parallelepiped shape" refer to all members having first and second principal surfaces, first and second side surfaces, and first and second end surfaces. Furthermore, unevenness may be included on a portion of or all of the principal surfaces, side surfaces, and end surfaces.

The dimensions of the ceramic element assembly 10 are not specifically limited. However, the ceramic element assembly 10 is preferably low-profile, so as to satisfy $T \leq W < L$, $(1/5)W \leq T \leq (1/2)W$, and $T \leq 0.3$ mm, where the thickness dimension of the ceramic element assembly 10 is assumed to be T, the length dimension is assumed to be L, and the width dimension is assumed to be L. Specifically, it is preferable that $0.1 \text{ mm} \leq T \leq 0.3 \text{ mm}$, $0.4 \text{ mm} \leq L \leq 1 \text{ mm}$, and $0.2 \text{ mm} \leq W \leq 0.5 \text{ mm}$ are satisfied.

As shown in FIGS. 3 and 6, inside of the ceramic element assembly 10, a plurality of substantially rectangular first and second internal electrodes 11 and 12 are disposed alternately in the height direction H at regular intervals. Each of the first and the second internal electrodes is parallel or substantially parallel to the first and the second principal surfaces 10a and 10b. The first and the second internal electrodes 11 and 12 are opposed to each other with the ceramic layer 10g therebetween in the height direction H.

The thickness of the ceramic layer 10g is not specifically limited. The thickness of the ceramic layer 10g may preferably be, for example, about 0.5 µm to about 10 µm. Likewise, the thickness of each of the first and the second internal electrodes is not specifically limited. The thickness of each of the first and the second internal electrodes 11 and 12 may preferably be, for example, about 0.2 µm to about 2 µm.

The first and the second internal electrodes 11 and 12 may be made of an appropriate electrically conductive material. The first and the second internal electrodes 11 and 12 may preferably be made of, for example, metals, such as Ni, Cu, Ag, Pd, and Au, or alloys, such as a Ag—Pd alloy, including at least one of these metals.

As shown in FIGS. 1 to 3, first and second external electrodes 13 and 14 are disposed on the surfaces of the ceramic element assembly 10. The first external electrode 13 is electrically connected to the first internal electrode 11. The first external electrode 13 includes a first portion 13a disposed on the first principal surface 10a, a second portion 13b disposed on the second principal surface 10b, and a third portion 13c disposed on a first end surface 10e. In the present preferred embodiment, the first external electrode 13 is preferably not substantially disposed on the first and the second side surfaces 10c and 10d.

Meanwhile, the second external electrode 14 is electrically connected to the second internal electrode 12. The second external electrode 14 includes a first portion 14a disposed on the first principal surface 10a, a second portion 14b disposed on the second principal surface 10b, and a third portion 14c disposed on a second end surface 10f. In the present preferred embodiment, the second external electrode 14 is preferably not substantially disposed on the first and the second side surfaces 10c and 10d.

Next, the configurations of the first and the second external electrodes 13 and 14 will be described. In this regard, in the present preferred embodiment, the first and second external electrodes 13 and 14 preferably have substantially the same configuration. Therefore, the configurations of the first and second external electrodes 13 and 14 will be described here with reference primarily to FIG. 4 showing a portion of the first external electrode 13.

As shown in FIG. 4, each of the first and the second external electrodes 13 and 14 is preferably a laminate that includes an underlying electrode layer 15 and first and second Cu plating films 16 and 17. The underlying electrode layer 15 is disposed on the ceramic element assembly 10. The first Cu plating film 16 is disposed on the underlying electrode layer 15. The second Cu plating film 17 is disposed on the first Cu plating film 16.

The underlying electrode layer 15 is preferably a layer to improve the adhesion strength between the first and the second external electrodes 13 and 14 and the ceramic element assembly 10. Therefore, the underlying electrode layer 15 preferably has a composition that improves the adhesion strength between the underlying electrode layer 15 and the ceramic element assembly 10 and, in addition, which improves the adhesion strength between the underlying electrode layer 15 and the first Cu plating film 16. Specifically, the underlying electrode layer 15 preferably includes a metal that is diffusible in Cu and a ceramic bonding material, for example.

The content of the metal that is diffusible in Cu in the underlying electrode layer 15 is preferably within the range of, for example, about 50 percent by volume to about 70 percent by volume. The content of the ceramic bonding material in the underlying electrode layer 15 is preferably within the range of, for example, about 30 percent by volume to about 50 percent by volume.

The ceramic bonding material is preferably a component to improve the adhesion strength to the ceramic element assembly 10. The type of the ceramic bonding material is selected such that, for example, when the ceramic element assembly is fired at the same time with the underlying electrode layer, the shrinkage behavior of the ceramic element assembly and the shrinkage behavior of the underlying electrode layer are similar to each other. It is preferable that the ceramic bonding material includes an element which is the primary component of the ceramic material included in the ceramic element assembly 10. More preferably, the ceramic bonding material is the same ceramic material as that of the ceramic material included as a primary component in the ceramic element assembly 10.

The metal that is diffusible in Cu (hereafter may be referred to as "diffusible metal") is preferably a component to improve the adhesion strength to the first Cu plating film 16. In the present preferred embodiment, this diffusible metal is preferably diffused in at least the surface layer in the underlying electrode layer 15 side of the first Cu plating film 16. Furthermore, Cu is diffused in the underlying electrode layer 15 from the first Cu plating film 16. In the present preferred embodiment, high adhesion between the underlying electrode layer 15 and the first Cu plating film 16 is achieved through this mutual diffusion.

More specifically, in the present preferred embodiment, grain boundaries are preferably present in the first Cu plating film 16, and the diffusible metal is diffused along the grain boundaries. Then, as shown in FIG. 5, a diffusion portion 16a, in which the diffusible metal is diffused, in the first Cu plating film 16 extends to the surface opposite to the underlying electrode layer 15 of the first Cu plating film 16. On the other hand, a diffusion portion 15a, in which Cu is diffused, is preferably present in the surface layer on the first Cu plating film 16 side of the underlying electrode layer 15.

The diffusion of the diffusible metal can be detected by polishing the side surface of the ceramic electronic component to the vicinity of the center in the W direction, so as to expose a cross-section parallel to the opposite surface, treating the resulting cross-section by using a focused ion beam (FIB), and performing element mapping of wavelength dispersive X-ray spectrometry (WDX).

The type of the diffusible metal is not specifically limited. For example, the diffusible metal may preferably be at least one metal selected from the group consisting of Ni, Ag, and Au. More preferably, Ni is used as the diffusible metal.

However, in the present preferred embodiment, the diffusible metal is substantially not diffused in the second Cu plating film 17. Consequently, the second Cu plating film 17 is substantially made of Cu.

The maximum thickness of the underlying electrode layer 15 may preferably be, for example, about 1 μm to about 20 μm. Preferably, the maximum thickness of the first Cu plating film 16 is, for example, about 2 μm to about 6 μm. Preferably, the maximum thickness of the second Cu plating film 17 is, for example, about 3 μm to about 6 μm.

Next, an example of a method for manufacturing the ceramic electronic component 1 according to a preferred embodiment of the present invention will be described.

Figure 7:
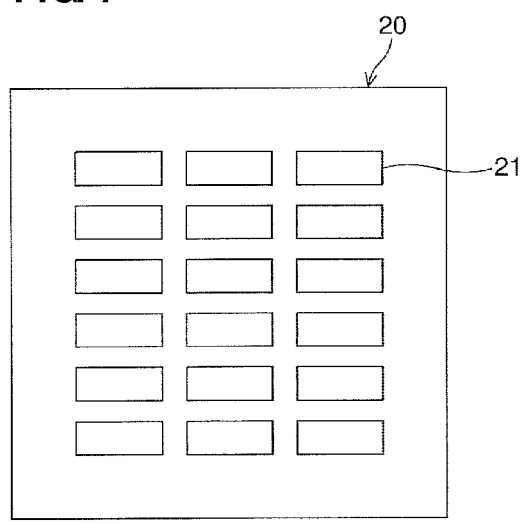
FIG. 7 is a schematic plan view of a ceramic green sheet provided with an electrically conductive pattern.

A ceramic green sheet 20 (refer to FIG. 7) including a ceramic material to define the ceramic element assembly 10 is prepared. As shown in FIG. 7, an electrically conductive paste is applied to the resulting ceramic green sheet 20 and, thereby, an electrically conductive pattern 21 is formed. In this regard, application of the electrically conductive paste can be performed by various printing methods, for example, a screen printing method. The electrically conductive paste may include binders and solvents used in the related art in addition to electrically conductive fine particles.

Figure 8:
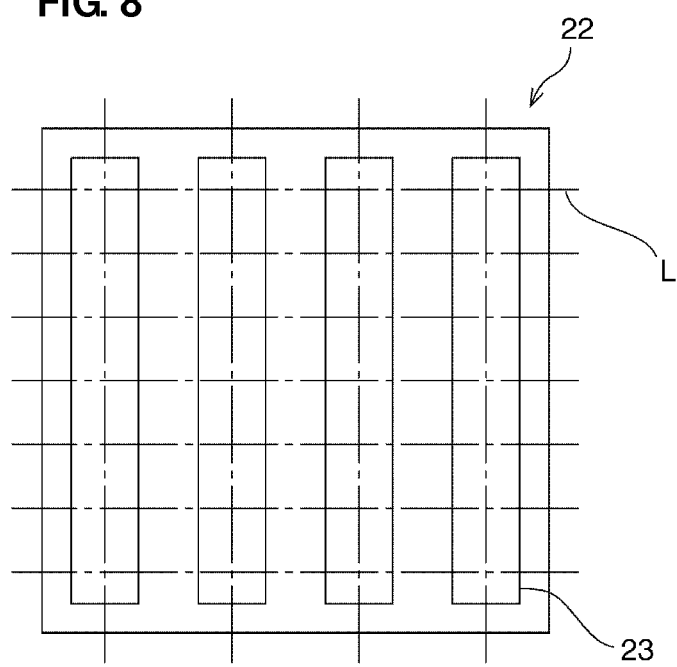
FIG. 8 is a schematic plan view of a mother laminate.

A mother laminate 22 shown in FIG. 8 is produced by laminating a plurality of ceramic green sheets 20 provided with no electrically conductive pattern 21, a ceramic green sheet 20 provided with an electrically conductive pattern 21 having the shape corresponding to the first internal electrode 11 or the second internal electrode 12, and a plurality of ceramic green sheets 20 provided with no electrically conductive pattern 21 in that order, and applying a hydrostatic pressure in the lamination direction.

An electrically conductive pattern 23 having the shape corresponding to portions defining the first and the second portions 13a and 13b of the underlying electrode layer 15 of the first and the second external electrodes 13 and 14 is formed on the mother laminate 22 by an appropriate printing method, e.g., a screen printing method. In this regard, the electrically conductive paste used for forming the electrically conductive pattern 23 preferably includes the diffusible metal and the ceramic bonding material.

A plurality of green ceramic laminates are produced from the mother laminate 22 by cutting the mother laminate 22 along virtual cut lines L. The cutting of the mother laminate 22 can be performed by dicing or force cutting, for example.

After the green ceramic laminate is formed, chamfering or R-chamfering of corner portions and ridge portions of the green ceramic laminate and polishing of the surface layer may be performed through barrel polishing or other suitable method, for example.

An electrically conductive paste is applied to both end surfaces of the green ceramic laminate and, thereby, an electrically conductive pattern having a shape corresponding to portions defining the third portion 13c of the underlying electrode layer 15 of the first and the second external electrodes 13 and 14 is formed. This application of the electrically conductive paste can be performed through, for example, dipping or screen printing. In this regard, the electrically conductive paste used for forming the electrically conductive pattern preferably includes the diffusible metal and the ceramic bonding material.

The green ceramic laminate is fired. In the firing step, the underlying electrode layer 15 and the first and the second internal electrodes 11 and 12 are fired at the same time (cofiring). The firing temperature can be set appropriately in accordance with the types of the ceramic material and the electrically conductive paste to be used. The firing temperature can preferably be specified to be, for example, about 900° C. to about 1,300° C.

The first Cu plating film 16 is formed by applying Cu plating to the underlying electrode layer 15. In the present preferred embodiment, the ceramic laminate is subjected to a heat treatment thereafter, so as to heat the first Cu plating film 16 and the underlying electrode layer 15. The diffusible metal included in the underlying electrode layer 15 is diffused into at least the surface layer in the underlying electrode layer 15 side of the first Cu plating film 16 by this heating step. Along with that, Cu in the first Cu plating film 16 is diffused into at least the surface layer in the first Cu plating film 16 side of the underlying electrode layer 15. That is, mutual diffusion between the underlying electrode layer 15 and the first Cu plating film 16 occurs.

In the heat treatment step of the first Cu plating film 16 and the underlying electrode layer 15, the first Cu plating film 16 and the underlying electrode layer 15 are preferably heated to about 350° C. to about 800° C., and more preferably about 550° C. to about 650° C. If the heating temperature of the first Cu plating film 16 and the underlying electrode layer 15 is too low, diffusion does not reliably occur. On the other hand, if the heating temperature of the first Cu plating film 16 and the underlying electrode layer 15 is too high, Cu included in the first Cu plating film 16 may be melted.

It is preferable that the above-described heat treatment step is performed in an atmosphere of inert gas, such as nitrogen or argon, for example. Consequently, oxidation of the first Cu plating film 16 is effectively prevented.

Thereafter, the second Cu plating film 17 is formed by Cu plating on the first Cu plating film 16, so as to complete the ceramic electronic component 1 shown in FIG. 1. As described above, in the present preferred embodiment, the second Cu plating film 17 is formed after the first Cu plating film 16 and the underlying electrode layer 15 are heat-treated. Consequently, the diffusible metal is diffused in the first Cu plating film 16, but the diffusible metal is not substantially diffused into the second Cu plating film 17. Therefore, the second Cu plating film 17 is formed substantially from Cu.

As described above, in the present preferred embodiment, the underlying electrode layer 15 is formed through cofiring.

Consequently, the first and the second portions 13a, 14a, 13b, and 14b of the first and the second external electrodes 13 and 14 can be formed so as to have small thicknesses. Therefore, the thickness of the ceramic electronic component 1 can be effectively reduced.

The underlying electrode layer 15 preferably includes the ceramic bonding material. Consequently, even when the underlying electrode layer 15 is formed through cofiring, the adhesion between the underlying electrode layer 15 and the ceramic element assembly 10 is improved.

Furthermore, the underlying electrode layer 15 preferably includes the metal that is diffusible in Cu, and the metal that is diffusible in Cu is diffused in at least the surface layer in the underlying electrode layer 15 side of the first Cu plating film 16. Consequently, the adhesion between the underlying electrode layer 15 and the first Cu plating film 16 is improved. In particular, when the metal that is diffusible in Cu is diffused to the surface opposite to the underlying electrode layer 15 of the first Cu plating film 16, the adhesion between the underlying electrode layer 15 and the first Cu plating film 16 is further improved.

In the present preferred embodiment, the second Cu plating film 17 substantially formed from Cu is disposed on the first Cu plating film 16. Consequently, even when the first and the second external electrodes 13 and 14 are irradiated with laser light, the laser light is reflected by the first and the second external electrodes 13 and 14 at a high reflectance. Therefore, even when the first and the second external electrodes 13 and 14 are irradiated with the laser light, the ceramic element assembly 10 is not damaged. That is, the ceramic electronic component 1 according to the present preferred embodiment has high resistance to the laser light.

As described above, regarding the present preferred embodiment, the thickness of the ceramic electronic component 1 can be reduced, the adhesion between the ceramic element assembly 10, the underlying electrode layer 15, and the first Cu plating film 16 can be improved, and, in addition, the reflectance at the first and the second external electrodes 13 and 14 with respect to the laser light can be increased. Therefore, a highly reliable ceramic electronic component 1 according to the present preferred embodiment can be effectively used as an embedded ceramic electronic component. When the ceramic electronic component 1 according to the present preferred embodiment is used as the embedded ceramic electronic component, via holes may preferably be formed in portions on the first and the second external electrodes 13 and 14 of the ceramic electronic component by using the laser light without damaging the ceramic electronic component 1.

In the present preferred embodiment, an example in which the ceramic electronic component is provided with at least one pair of internal electrodes and the first and the second external electrodes has been described. However, preferred embodiments of the present invention are not limited to this configuration. In preferred embodiments of the present invention, it is necessary that the ceramic electronic component includes at least one external electrode, and, for example, the internal electrode is not necessarily included.

Other examples of preferred embodiments of the present invention will be described below. In this regard, in the following explanations, the elements and components having substantially the same functions as those in the above-described first preferred embodiment are not described below.

Second Preferred Embodiment

Figure 9:
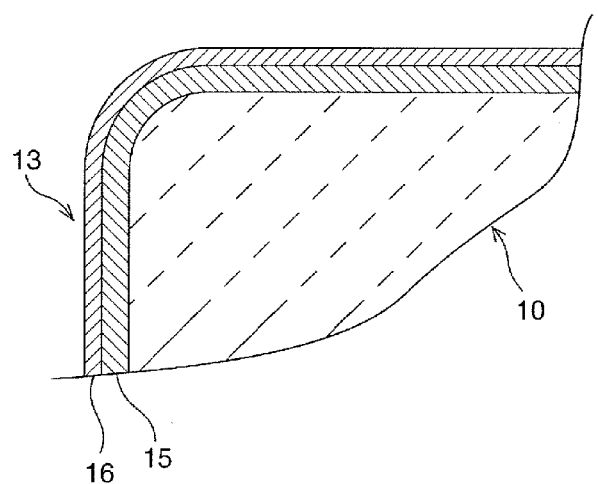
FIG. 9 is a magnified schematic sectional view of a part of a ceramic electronic component according to a second preferred embodiment of the present invention.

FIG. 9 is a magnified schematic sectional view of a portion of a ceramic electronic component according to a second preferred embodiment of the present invention.

In the first preferred embodiment, an example in which the first and the second external electrodes 13 and 14 include a laminate including the underlying electrode layer 15 and the first and the second Cu plating films 16 and 17 was described. However, preferred embodiments of the present invention are not limited to this configuration. The external electrode is not specifically limited insofar as the underlying electrode layer and at least one Cu plating film laminated on the underlying electrode layer are included.

For example, as shown in FIG. 9, each of the first and the second external electrodes 13 and 14 may preferably include a laminate including an underlying electrode layer 15 and a first Cu plating film 16 disposed on the underlying electrode layer 15. In this case, it is preferable that the diffusible metal included in the underlying electrode layer 15 is not diffused to the surface opposite to the underlying electrode layer 15 of the first Cu plating film 16. That is, it is preferable that the surface layer opposite to the underlying electrode layer 15 of the first Cu plating film 16 is substantially made of Cu.

However, the diffusion is difficult to control in such a way that the diffusible metal is not diffused to the surface opposite to the underlying electrode layer 15 of the first Cu plating film 16. Consequently, in order to ensure that the surface layers opposite to the ceramic element assembly 10 of the first and the second external electrodes 13 and 14 are substantially made Cu, it is preferable to provide a second Cu plating film 17.

Third Preferred Embodiment

Figure 10:
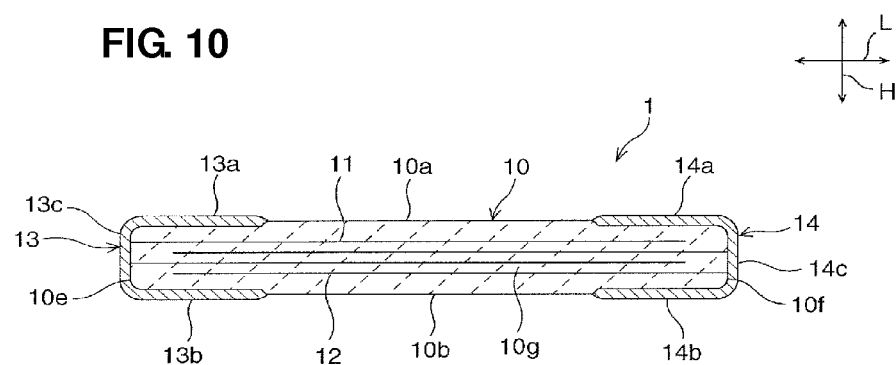
FIG. 10 is a schematic sectional view of a ceramic electronic component according to a third preferred embodiment of the present invention.

FIG. 10 is a schematic sectional view of a ceramic electronic component according to a third preferred embodiment of the present invention.

In the first preferred embodiment, the first and the second principal surfaces 10a and 10b include a portion provided with the first external electrode 13 or the second external electrode 14 and a portion not provided with the first external electrode 13 nor the second external electrode 14 that are arranged so as to be flush or substantially flush with each other. However, preferred embodiments of the present invention are not limited to this configuration. The first and the second principal surfaces 10a and 10b may preferably include a portion provided with the first external electrode 13 or the second external electrode 14 and a portion not provided with the first external electrode 13 or the second external electrode 14 that are not necessarily arranged so as to be flush or substantially flush with each other.

For example, as shown in FIG. 10, the first and the second principal surfaces 10a and 10b preferably include a portion provided with the first external electrode 13 or the second external electrode 14 that is inward of the portion not provided with the first external electrode 13 or the second external electrode 14 in the height direction H. In this case, the ceramic electronic component 1 has a lower profile.

Fourth Preferred Embodiment

Figure 11:
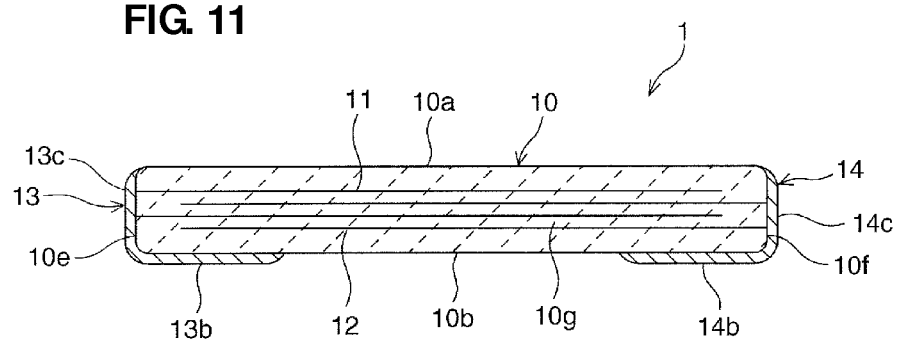
FIG. 11 is a schematic sectional view of a ceramic electronic component according to a fourth preferred embodiment of the present invention.

FIG. 11 is a schematic sectional view of a ceramic electronic component according to a fourth preferred embodiment of the present invention.

In the first preferred embodiment, an example in which each of the first and the second external electrodes 13 and 14 is disposed on both the first and the second principal surfaces 10a and 10b is described. However, preferred embodiments of the present invention are not limited to this configuration. Each of the first and the second external electrodes 13 and 14 may be provided on any portion of the surface of the ceramic element assembly 10.

For example, as shown in FIG. 11, each of the first and the second external electrodes 13 and 14 may preferably be provided on only the second principal surface 10b of the first and the second principal surfaces 10a and 10b. When each of the first and the second external electrodes 13 and 14 is provided on at least one of the first and the second principal surfaces 10a and 10b, as described above, the ease of molding of the ceramic electronic component 1 is improved.

Fifth Preferred Embodiment

Figure 12:
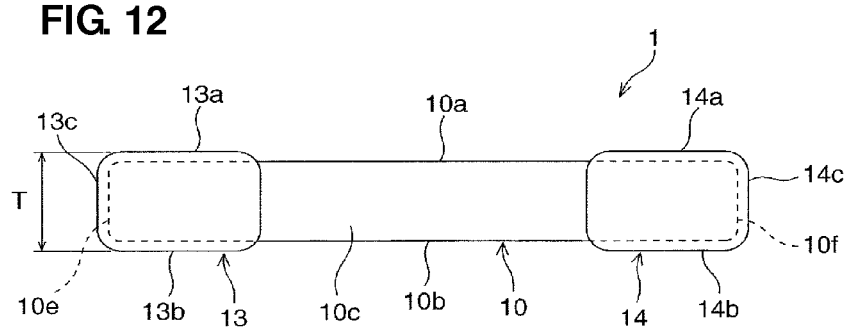
FIG. 12 is a schematic side view of a ceramic electronic component according to a fifth preferred embodiment of the present invention.

FIG. 12 is a schematic side view of a ceramic electronic component according to a fifth preferred embodiment of the present invention.

In the first preferred embodiment, an example in which the first and the second external electrodes 13 and 14 are substantially not disposed on the first and the second side surfaces 10c and 10d is described. However, as shown in FIG. 12, the first and the second external electrodes 13 and 14 may preferably also be provided on the first and the second side surfaces 10c and 10d.

Sixth Preferred Embodiment

Figure 13:
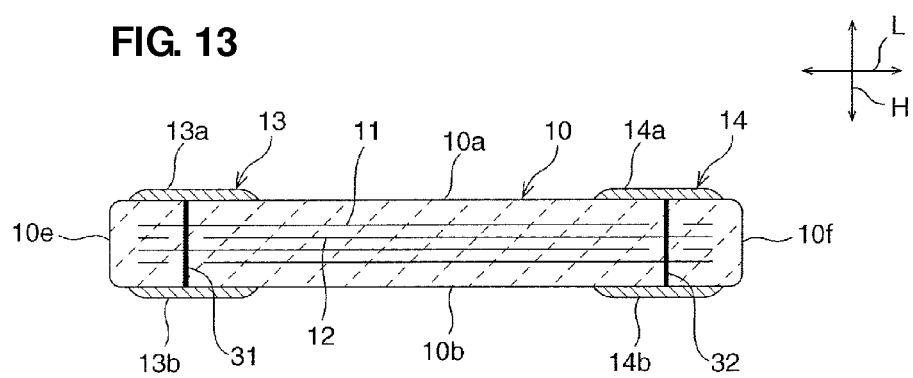
FIG. 13 is a schematic sectional view of a ceramic electronic component according to a sixth preferred embodiment of the present invention.

FIG. 13 is a schematic sectional view of a ceramic electronic component according to a sixth preferred embodiment of the present invention.

In the first preferred embodiment, an example in which the first and the second internal electrodes 11 and 12 extend to the first end surface 10e or the second end surface 10f and, in addition, the first and the second external electrodes 13 and 14 are provided on the first and the second end surfaces 10e and 10f, so as to electrically connect the first and the second internal electrodes 11 and 12 to the first external electrode 13 or the second external electrode 14 is described. However, preferred embodiments of the present invention are not limited to this configuration.

For example, as shown in FIG. 13, via hole electrodes 31 and 32 may preferably be provided, and the first and the second internal electrodes 11 and 12 may preferably extend to the first and the second principal surfaces 10a and 10b, so as to be electrically connected to the first and the second external electrodes 13 and 14 on the first and the second principal surfaces 10a and 10b. In this case, it is sufficient that the first and the second external electrodes 13 and 14 are provided on at least one of the first and the second principal surfaces 10a and 10b, and the first and the second external electrodes 13 and 14 are not necessary provided on the first and the second side surfaces 10c and 10d and the first and the second end surfaces 10e and 10f.

Seventh Preferred Embodiment

Figure 14:
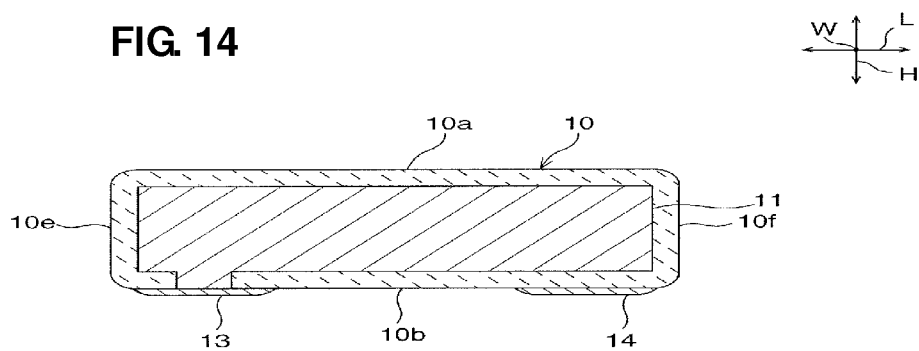
FIG. 14 is a schematic sectional view along the height direction H and the length direction L of a ceramic electronic component according to a seventh preferred embodiment of the present invention.
Figure 15:
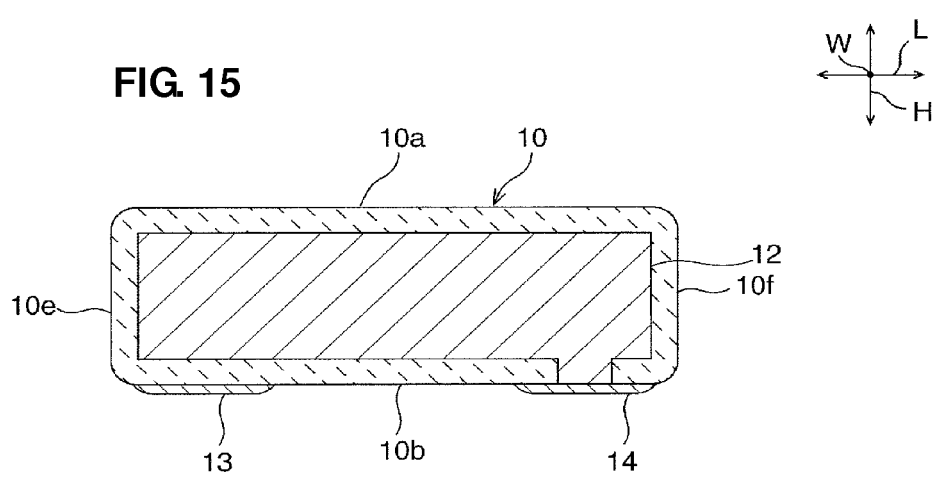
FIG. 15 is a schematic sectional view along the height direction H and the length direction L of a ceramic electronic component according to the seventh preferred embodiment of the present invention.

FIGS. 14 and 15 are schematic sectional views along the height direction H and the length direction L of a ceramic electronic component according to a seventh preferred embodiment of the present invention.

In the first preferred embodiment, an example in which the first and the second internal electrodes 11 and 12 are arranged in parallel to the first and the second principal surfaces 10a and 10b and, in addition, extend to the first and the second end surfaces 10e and 10f is described. However, preferred embodiments of the present invention are not limited to this configuration.

For example, as shown in FIGS. 14 and 15, the first and the second internal electrodes 11 and 12 may preferably be arranged in parallel along the height direction H and the length direction L, and the first and the second internal electrodes 11 and 12 may preferably be laminated along the width direction W. In this case, the first and the second internal electrodes 11 and 12 may preferably extend directly to at least one of the first and the second principal surfaces 10a and 10b and be connected directly to the first and the second external electrodes 13 and 14 and led to at least one of the first and the second principal surfaces 10a and 10b.

Figure 16:
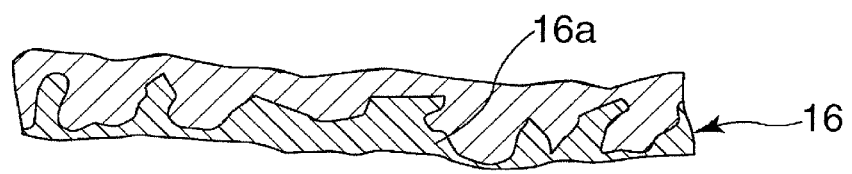
FIG. 16 is a magnified schematic sectional view of a portion of a first external electrode according to a modified example of a preferred embodiment of the present invention.

FIG. 16 is a magnified schematic sectional view of a portion of a first external electrode according to a modified example of a preferred embodiment of the present invention.

In the first preferred embodiment, as shown in FIG. 5, an example in which the diffusion portion 16a extends to the surface opposite to the underlying electrode layer 15 of the first Cu plating film 16 was described. However, preferred embodiments of the present invention are not limited to this configuration. For example, as shown in FIG. 16, the diffusion portion 16a is not necessarily allowed to extend to the surface opposite to the underlying electrode layer 15 of the first Cu plating film 16.

Example 1

In the present example, a ceramic electronic component having the same configuration as that of the ceramic electronic component 1 according to the first preferred embodiment and functioning as a ceramic capacitor was produced by the manufacturing method explained in the first preferred embodiment under the following condition.

Dimension of ceramic electronic component: about 1.0 mm×about 0.5 mm×about 0.15 mm Volume of ceramic electronic component: about 10 nF Rated working voltage of ceramic electronic component: about 6.3 V Primary component of ceramic material constituting ceramic element assembly: $BaTiO_3$ Underlying electrode layer: about 50 percent by volume of Ni is included as the metal that is diffusible in Cu. Furthermore, about 50 percent by volume of ceramic bonding material is included.

Condition of formation of underlying electrode layer: firing at about 1,200° C. for about 2 hours Thickness of underlying electrode layer: about 5 μm Thickness of first Cu plating film: about 4 μm Thickness of second Cu plating film: about 4 μm Condition of heat treatment to diffuse Ni into first Cu plating film: keeping at about 600° C. (maximum temperature) for about 10 minutes, total heat treatment time: about 1 hour, atmosphere: substantially inert gas atmosphere having oxygen concentration of about 10 ppm or less The side surface of the ceramic electronic component produced as described above was polished to the vicinity of the center in the W direction, a cross-section parallel to the opposite surface was exposed, the resulting cross-section was treated by using a focused ion beam (FIB), element mapping of wavelength dispersive X-ray spectrometry (WDX) was performed and, thereby, it was ascertained that Ni was diffused in the first Cu plating film.

Comparative Example 1

A ceramic electronic component was produced as in Example 1 described above except that the heat treatment to diffuse Ni into the first Cu plating film was not performed.

The ceramic electronic component produced as described above was cut to expose the cross-section of the external electrode, and observation was performed by using an electron microscope. As a result, it was ascertained that Ni was not diffused in the first Cu plating film.

The second principal surface side of the ceramic electronic component produced in each of Example 1 and Comparative example 1 described above was bonded to a glass epoxy substrate by using an electrically conductive adhesive. Thereafter, an adhesive tape (Cellotape (registered trademark) No. 252 produced by Sekisui Chemical Co., Ltd.) was stuck on the first principal surface side of the ceramic electronic component, and was peeled off by pulling with a constant tension along the length direction of the ceramic electronic component (180° peeling test). Subsequently, an observation whether peeling in the plating film occurred or not was performed by using an electron microscope. This test was performed with respect to 100 samples each of Example 1 and Comparative example 1 and the proportion of samples in which an occurrence of peeling of plating film was observed was measured. As a result, regarding Example 1, peeling was substantially not observed with respect to every sample. On the other hand, regarding Comparative example 1, peeling was observed with respect to about 75% of samples.

As is clear from this result, the adhesion strength of the first Cu plating film is improved by diffusing the metal contained in the underlying electrode layer into the first Cu plating film.

The second principal surface side of the ceramic electronic component produced in each of Example 1 and Comparative example 1 described above was bonded to a glass epoxy substrate by using an electrically conductive adhesive. Thereafter, a load was applied at about 0.5 mm/sec from both sides in the length direction of the ceramic electronic component by using a loading jig until the external electrode was peeled off.

As a result, regarding Comparative Example 1, peeling of the Cu plating film was observed, whereas regarding Example 1, peeling of the Cu plating film was substantially not observed even when the test was continued until the ceramic element assembly was broken.

As is clear from this result, the adhesion strength of the first Cu plating film is improved by diffusing the metal contained in the underlying electrode layer into the first Cu plating film.

Regarding the ceramic electronic component produced in each of Example 1 and Comparative example 1, 72 samples were mounted on glass epoxy substrates by using eutectic solder. Thereafter, about 6.3 V of voltage was applied to the sample for about 1,000 hours in a high-temperature high-humidity bath at about 85° C. and a relative humidity of about 83% RH. A sample having an insulation resistance value after the load life in humidity test of about 10 GΩ or less was counted as a defective sample. As a result, regarding Example 1, among 72 samples, the sample evaluated as a defective sample was substantially 0. On the other hand, regarding Comparative example 1, 30 samples were evaluated as substantially defective samples among 72 samples.

As is clear from the results described above, the moisture resistance of the ceramic electronic component is improved by diffusing the metal contained in the underlying electrode layer into the first Cu plating film.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
    a ceramic element assembly including first and second principal surfaces, first and second side surfaces, and first and second end surfaces;
    underlying electrode layers located at least on predetermined areas of the first and second principal surfaces;
    first plating layers located at least on the underlying electrode layers; and
    second plating layers located at least on the first plating layers; wherein
    each of the underlying electrode layers includes a metal and a ceramic bonding material;
    each of the first plating layers includes Cu and the metal from the respective underlying electrode layer;
    each of the second plating layers includes Cu and does not include the metal from the respective underlying electrode layer; and
    a thickness of the ceramic electronic component is about 0.15 mm.

2. The ceramic electronic component according to claim 1, wherein the underlying electrode layers are located only on the predetermined areas.

3. The ceramic electronic component according to claim 1, wherein the first plating layers are located at predetermined areas of the first and second end surfaces.

4. The ceramic electronic component according to claim 1, wherein the first plating layers are located at predetermined areas of the first and second side surfaces.

5. The ceramic electronic component according to claim 1, wherein the underlying electrode layers are further located on predetermined areas of the first and second end surfaces.

6. The ceramic electronic component according to claim 5, wherein the first plating layers are further located on the underlying electrode layers on the first and second end surfaces.

7. The ceramic electronic component according to claim 1, wherein the underlying electrode layers are further located on predetermined areas of the first and second side surfaces.

8. The ceramic electronic component according to claim 7, wherein
    the first plating layers are further located on the underlying electrode layers on the first and second side surfaces.

9. The ceramic electronic component according to claim 1, wherein the metal from each of the underlying electrode layers extends to a boundary between the respective first plating layer and the respective second plating layer.

10. The ceramic electronic component according to claim 9, wherein the metal from each of the underlying electrode layers is at least one metal selected from the group consisting of Ni, Ag, Pd, and Au.

11. The ceramic electronic component according to claim 1, wherein
    the underlying electrode layers include:
        a first underlying electrode layer located on a first area of the predetermined area of the first principal surface adjacent to the first end surface; and
        a second underlying electrode layer located on a second area of the predetermined area of the first principal surface adjacent to the second end surface;
    a first internal electrode is disposed in the ceramic element assembly and a portion of the first internal electrode extends to the first end surface;
    a second internal electrode is disposed in the ceramic element assembly and a portion of the second internal electrode extends to the second end surface;
    an edge of the first internal electrode opposite to the portion of the first internal electrode extending to the first end surface is overlapped with the second area when viewed in a direction perpendicular to the first and second principal surfaces; and
    an edge of the second internal electrode opposite to the portion of the second internal electrode extending to the second end surface is overlapped with the first area when viewed in the direction perpendicular to the first and second principal surfaces.

12. The ceramic electronic component according to claim 1, wherein
the first principal surface of the ceramic element assembly includes a first portion on which at least one of the underlying electrode layers is located and a second portion on which the underlying electrode layers are not located; and
the first portion is inward of the second portion in a thickness direction of the ceramic element assembly.

13. The ceramic electronic component according to claim 1, wherein
the first principal surface of the ceramic element assembly includes a first portion on which at least one of the underlying electrode layers is located and a second portion on which the underlying electrode layers are not located; and
a thickness of the ceramic element assembly including the first portion of the principal surface is less than a thickness of the ceramic element assembly including the second portion of the principal surface.

14. The ceramic electronic component according to claim 10, wherein
the underlying electrode layers include:
a first underlying electrode layer located on a first area of the predetermined area of the first principal surface adjacent to the first end surface; and
a second underlying electrode layer located on a second area of the predetermined area of the first principal surface adjacent to the second end surface;
a first internal electrode is disposed in the ceramic element assembly and a portion of the first internal electrode extends to the first end surface;
a second internal electrode is disposed in the ceramic element assembly and a portion of the second internal electrode extends to the second end surface;
an edge of the first internal electrode opposite to the portion of the first internal electrode extending to the first end surface is overlapped with the second area when viewed in a direction perpendicular to the first and second principal surfaces; and
an edge of the second internal electrode opposite to the portion of the second internal electrode extending to the second end surface is overlapped with the first area when viewed in the direction perpendicular to the first and second principal surfaces.

15. The ceramic electronic component according to claim 14, wherein
the first principal surface of the ceramic element assembly includes a third area on which the underlying electrode layers are not located; and
at least one of the first and second areas is inward of the third area in a thickness direction of the ceramic element assembly.

16. The ceramic electronic component according to claim 14, wherein
the first principal surface of the ceramic element assembly includes a third area on which the underlying electrode layers are not located; and
a thickness of the ceramic element assembly including at least one of the first and second areas is less than a thickness of the ceramic element assembly including the third area.

\* \* \* \* \*